United States Patent
Zhang et al.

(10) Patent No.: US 9,618,418 B2
(45) Date of Patent: Apr. 11, 2017

(54) SYSTEM AND METHOD FOR DETECTING LEAKAGE IN A GAS PIPELINE

(71) Applicants: Yue Zhang, Singapore (SG); Hao Ming Chang, Singapore (SG)

(72) Inventors: Yue Zhang, Singapore (SG); Hao Ming Chang, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 224 days.

(21) Appl. No.: 14/541,353

(22) Filed: Nov. 14, 2014

(65) Prior Publication Data

US 2016/0138996 A1     May 19, 2016

(51) Int. Cl.
    *G01M 3/28*     (2006.01)
    *F17D 5/02*     (2006.01)
    *G01F 1/00*     (2006.01)

(52) U.S. Cl.
    CPC ............ *G01M 3/2807* (2013.01); *F17D 5/02* (2013.01); *G01F 1/00* (2013.01)

(58) Field of Classification Search
CPC ........ G01M 3/28; G01M 3/2807; G01M 3/26; G01M 3/00; G01F 1/00; F17D 5/02
See application file for complete search history.

(56) References Cited

U.S. PATENT DOCUMENTS 4,364,261 A * 12/1982 Askwith ................. G01M 3/26
    73/40
4,776,206 A * 10/1988 Armstrong .......... G01M 3/3254
    73/40
4,896,528 A * 1/1990 Lewis ..................... G01M 3/02
    73/40.7
5,030,033 A * 7/1991 Heintzelman .......... B65D 88/76
    220/88.3
5,261,268 A * 11/1993 Namba ................ G01M 3/2807
    340/605
5,269,171 A * 12/1993 Boyer ................. G01M 3/2807
    73/40.5 R (Continued)

FOREIGN PATENT DOCUMENTS

JP     2009281934 A * 12/2009 ............ G01M 3/26
JP     2011247606 A * 12/2011 ............ G01M 3/28

*Primary Examiner* — Nguyen Ha
(74) *Attorney, Agent, or Firm* — Ostrolenk Faber LLP

(57) ABSTRACT

Disclosed is a leakage detection system (200) and a leakage detection method for detecting leakage in a gas supply system (10') comprising a gas source (11; 12) connected to a gas delivery module (14) by a pipeline. The leakage detection system (200) comprises a flow meter (113) connectable along the pipeline remotely from an inlet of the gas delivery module (14); and a detection module (110) configured to receive signals representing a measured flow rate from the flow meter (113), and to compare the measured flow rate (115) to a stored leakage-free reference value (116) to detect an increase in flow rate in the presence of a leak. A flow resistance between the detection module (110) and an outlet of the gas delivery module (14) amplifies the increase in flow rate in the presence of a leak. The system (200) may comprise a flow rate elevation system (121) connectable between the gas source (11; 12) and the flow meter (113) for temporarily increasing the flow rate in the pipeline.

8 Claims, 4 Drawing Sheets

(56) References Cited

U.S. PATENT DOCUMENTS

| | | | |
|---|---|---|---|
| 7,454,956 B1 * | 11/2008 | LoPresti | G01M 3/3227 |
| | | | 165/11.1 |
| 7,628,307 B2 | 12/2009 | Wong et al. | |
| 8,083,763 B2 * | 12/2011 | McEwen | A61B 17/1355 |
| | | | 606/202 |
| 2011/0308300 A1 * | 12/2011 | Bandaru | G01M 3/22 |
| | | | 73/40.5 R |
| 2011/0309780 A1 * | 12/2011 | Bandaru | G01M 3/22 |
| | | | 318/490 |

\* cited by examiner

SYSTEM AND METHOD FOR DETECTING LEAKAGE IN A GAS PIPELINE

TECHNICAL FIELD

This invention relates to an apparatus and method for detecting leakage in a gas pipeline. It is particularly, though not exclusively, applicable to detection of gas leakage in inert gas supplies of the type used in wire bonding systems.

BACKGROUND

Wire bonding is a commonly used technique for making interconnections between a semiconductor device and its packaging, or to connect a device to another device. For example, in one type of wire bonding called ball bonding, a wire is fed through a capillary of a wire bonding tool, and a charge is applied to the tip of the wire (using an electronic flame-off device, for example) to melt it and to form a ball of molten metal.

When bonding wires made of reactive materials such as copper or aluminum are used for wire bonding, there is a tendency for oxidation of the molten ball to occur when the melted material reacts with oxygen in the atmosphere. Oxidation of the molten ball degrades the quality of the subsequent ball bond that is formed. Therefore, it is usually necessary to provide a shielding gas comprising a relatively inert gas such as nitrogen or argon gas to occlude the wire during ball formation and prevent contact with oxygen. The shielding gas is generally supplied via a shielding gas implement having an outlet adjacent the capillary, for example via a slot or sleeve surrounding the capillary tip as shown in U.S. Pat. No. 7,628,307, the contents of which are incorporated by reference as if fully set forth herein.

It is important to ensure that the supply of shielding gas is stable, such that ball bonds are formed consistently and without surface oxides. If there are any leakages in the pipeline of the gas supply system feeding the shielding gas implement (or other gas implement employed by the wire bonding apparatus), this will significantly affect the stability of the gas feed.

Flow rate sensors can only measure the flow rate at their inputs. Accordingly, in order to be able to reliably measure leakage in a pipeline, two sensors are required: one at the input end, and one at the output end. A detected difference in flow rates between the inlet and outlet sensors indicates a leakage. A problem with attaching a sensor at the output end of a gas supply system of a wire bonding system is that such a sensor not only adds more cost, but also adds more weight to the system, which may not be allowed in some applications. In addition, many flow rate sensors have low resolution, and cannot sense variations in flow rate which are small but which might nonetheless have an effect on ball formation.

There remains a need for a system and method for reliably detecting leakages in shielding gas supply systems for wire bonding.

SUMMARY

Certain embodiments of the invention relate to a leakage detection system for detecting leakage in a gas supply system comprising a gas source connected to a gas delivery module by a pipeline, the leakage detection system comprising:

a flow meter connectable along the pipeline remotely from an inlet of the gas delivery module; and a detection module configured to receive signals representing a measured flow rate from the flow meter, and to compare the measured flow rate to a stored leakage-free reference value to detect an increase in flow rate in the presence of a leak;

wherein a flow resistance between the detection module and an outlet of the gas delivery module amplifies the increase in flow rate in the presence of a leak.

The flow resistance may comprise an intrinsic flow resistance of the gas delivery module. Alternatively, or in addition, the flow resistance may comprise a flow resistor element (which may have a constriction, for example), the flow resistor being connectable between the flow meter and the inlet of the gas delivery module.

In certain embodiments, a flow rate elevation system may be connectable between the gas source and the flow meter for temporarily increasing the flow rate in the pipeline.

Other embodiments of the invention relate to a gas supply system for a wire bonding process, comprising:

a gas source;

a gas delivery module; and a leakage detection system as hereinbefore described, the leakage detection system being connected between the gas source and the gas delivery module.

Further embodiments of the invention relate to a method of detecting leakage in a pipeline connected between a gas source and a gas delivery module, the method comprising steps of:

connecting a flow rate sensor along the pipeline remotely from an inlet of the gas delivery module;

measuring a flow rate along the pipeline using the flow rate sensor;

comparing the flow rate to a stored leakage-free reference value; and if the flow rate is higher than a predetermined level above the leakage-free reference value, determining that there is a leakage in the pipeline.

The predetermined level may be 10% above the leakage-free reference value.

The method may further comprise introducing or increasing a flow resistance in the pipeline.

In certain embodiments, the method may further comprise temporarily increasing the flow rate from the gas source.

The method may further comprise determining the leakage-free reference value.

BRIEF DESCRIPTION OF THE DRAWINGS

Embodiments of the invention will now be described, by way of non-limiting example only, with reference to the accompanying drawings in which.

DETAILED DESCRIPTION

The following discussion of certain embodiments relates to application of the invention to detection of leakages in a shielding gas supply for a wire bonding process. However, it will be appreciated that the invention may also have application in other contexts where stable gas flow is required.

Figure 1:
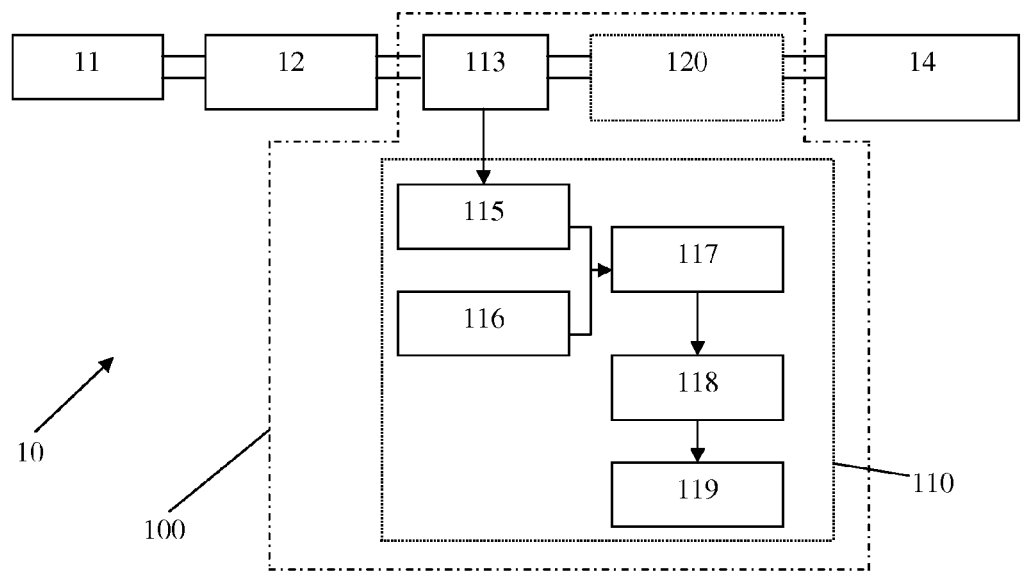
FIG. 1 is a block diagram of a shielding gas supply system comprising a leakage detection system according to embodiments of the invention.

Referring to FIG. 1, there is shown an embodiment of a gas supply system 10 for connection to a wire bonding tool (not shown). The system 10 comprises a source of inert gas comprising gas container 11 coupled to pressure regulator 12. If there is leakage from the pipeline downstream of the pressure regulator 12, the load flow rate will tend to increase. Accordingly, the pressure regulator 12 will respond to the change in the load flow rate by adjusting regulator flow upwards in order to maintain a desired pressure.

The gas source 11, 12 supplies gas to an inlet of a gas delivery module 14, an outlet of which is connected to the wire bonding tool. Connected in series between the gas source 11, 12 and the inlet of gas delivery module 14 is a leakage detection apparatus 100 which is shown in dotted outline. In the embodiments described below, the gas supply system 10 is a shielding gas supply system which supplies inert gas to the wire bonder via a shielding gas delivery tool 14. However, it will be appreciated that the invention is applicable to other gas supply systems, which may have gas implements other than shielding gas delivery tools.

Leakage detection system 100 comprises a flow sensor 113 connected in series with a gas flow rate control system 120. A measured flow rate from flow sensor 113 is received by a detection module 110, which in general terms is configured to detect changes in flow rate from that which would be expected if no leakages are present. The leakage detection system 100 may advantageously be used to run a leakage detection test prior to commencing a wire bonding process, to ensure that a pipeline between the gas source 11, 12 and shielding gas delivery module 14 is leak-free, and then left in place such that the leak-free pipeline is used during the wire bonding process.

Flow meter 113 may be a digital flow meter, such as a MPC-0002B mass flow controller of Azbil Corporation (Japan), which operates in fully open (readout) mode to thereby act as a flow sensor rather than a flow controller as such.

In one embodiment, the detection module 110 comprises a flow signal generator 115, storage means 116, processor 117, and leakage determination module 118. The flow signal generator 115 receives the measured flow rate value from flow sensor 113 and generates a digital signal to transmit to processor 117. Processor 117 may be part of a general-purpose computer system such as a 32-bit or 64-bit Intel Architecture-based computer system. Alternatively, in some embodiments, the processor 117 may be replaced with a simple comparator circuit for comparing the signal from signal generator 115 with a signal (representing a reference flow rate) from storage 116. Leakage determination module 118 may be a software module stored on non-volatile (e.g., hard disk) storage 116 of the general-purpose computer system. Alternatively, leakage determination module 118 may be a dedicated hardware component, such as an application-specific integrated circuit (ASIC) or field programmable gate array (FPGA). Detection module 110 may trigger an alarm signal 119 when a leak is detected by leakage determination module 118. The alarm signal 119 may be used to display or sound a physical alert to an operator, via the computer system for example.

As previously mentioned, leakage in the pipeline downstream of the pressure regulator 12 will tend to increase the flow rate due to regulator 12 needing to maintain the user-defined pipeline pressure. If the gas delivery module 14 has a large inherent flow resistance this will tend to exacerbate the flow of inert gas out of the leakage point in the pipeline, thus increasing the likelihood that departures from the expected (leakage-free) flow rate can be detected by leakage detection system 100. Preferably, though, an additional flow resistance can be added between the flow sensor 113 and the inlet of the gas delivery module 14. This is particularly advantageous for shielding gas delivery modules, which have a low inherent flow resistance. The additional flow resistance will further amplify any change in flow rate due to a leakage. For example, if flow rate control system 120 has an intrinsic flow resistance, this can provide the additional flow resistance. Alternatively, or in addition, a separate flow resistor can be added in series between the flow rate control system 120 and the inlet of shielding gas delivery module 14, to further increase the flow resistance in the pipeline and thus the change in flow rate due to any leakage. The increase in flow resistance and consequent amplification of the change in flow rate can advantageously make relatively small leakages detectable even by low-resolution flow meters 113.

Figure 2:
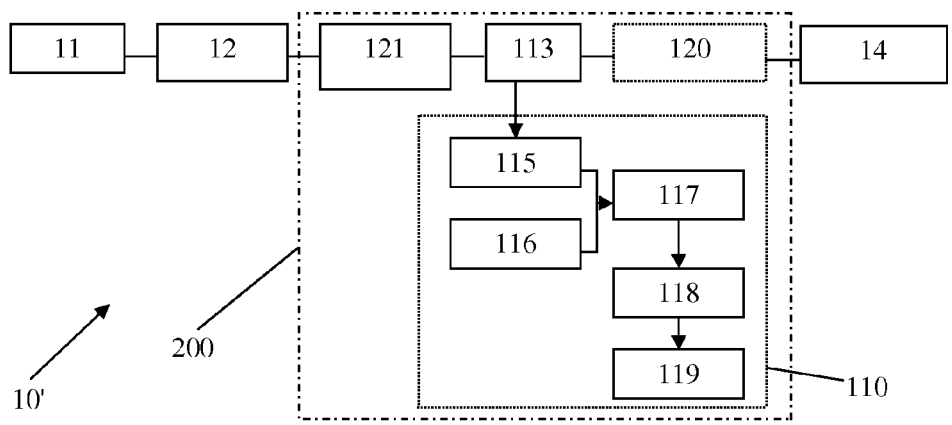
FIG. 2 is a block diagram of a shielding gas supply system comprising a leakage detection system according to alternative embodiments.

In a typical wire bonding process, the operating flow rate is generally quite low. Thus even with large flow resistance (e.g., from shielding gas delivery module 14 and/or gas flow rate control system 120), flow rate variation due to a leak may be smaller than or at the resolution of flow sensor 113. Accordingly, in an alternative embodiment of a shielding gas supply system 10' as shown in FIG. 2, it may be advantageous to temporarily artificially increase the flow rate during leakage testing, and then reduce it back to the operating flow rate when testing is complete and wire bonding is about to commence. In FIG. 2, an active flow rate elevation system 121 of leakage detection system 200 is inserted between pressure regulator 12 and flow sensor 113. When the leakage detection process begins, the active flow rate elevation system 121 elevates the initial flow rate from regulator 12 to a higher level. As in the embodiment of FIG. 1, the initial flow rate will be suppressed by the intrinsic flow resistance of shielding gas delivery module 14. Thus if leakage happens between flow sensor 113 and shielding gas delivery module 14, it will tend to increase the flow rate, but in the system of FIG. 2, more gas will escape from the leakage point than in FIG. 1, leading to a larger and thus more easily detectable flow rate increase. The increase in flow rate will thus be more likely to be distinguished by a low resolution flow sensor 113.

Figure 3:
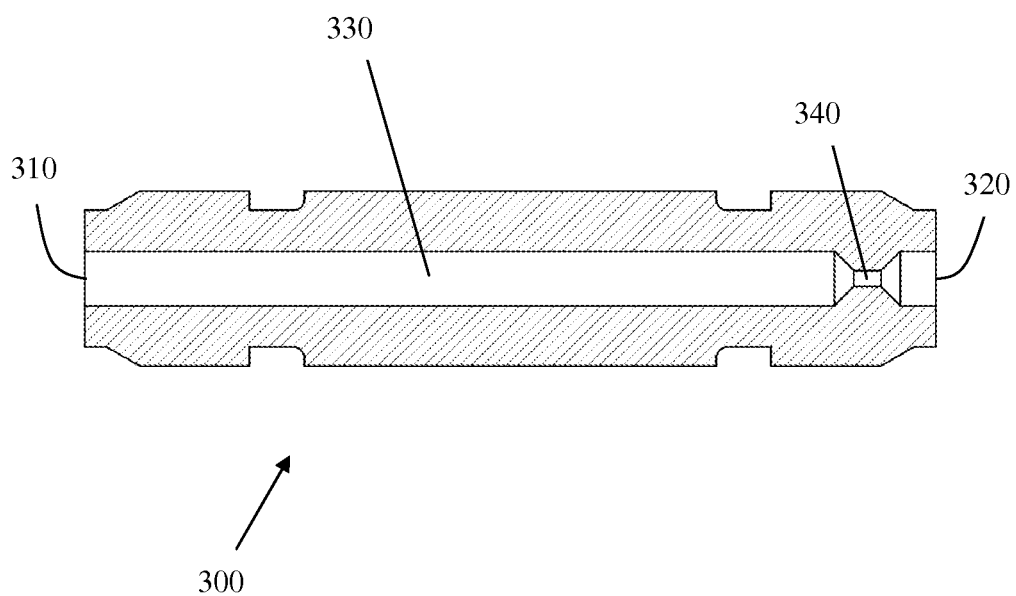
FIG. 3 is an example of a flow resistor which can be used in the systems of FIG. 1 and FIG. 2.

FIG. 3 shows a cross-section through an exemplary flow resistor 300 suitable for connection in a pipeline between gas flow rate control system 120 and shielding gas delivery module 14. The flow resistor 300 has a channel 330 having an inlet 310 at one end and an outlet 320 at the other end. Adjacent the outlet 320 is a constriction 340. The channel 330 may be approximately 1 mm in diameter and the constriction 340 may be approximately 0.3 mm in diameter and approximately 0.5 mm in length. However, any dimensions suitable for providing flow resistance sufficient to provide a detectable increase in flow rate may be used.

Figure 4:
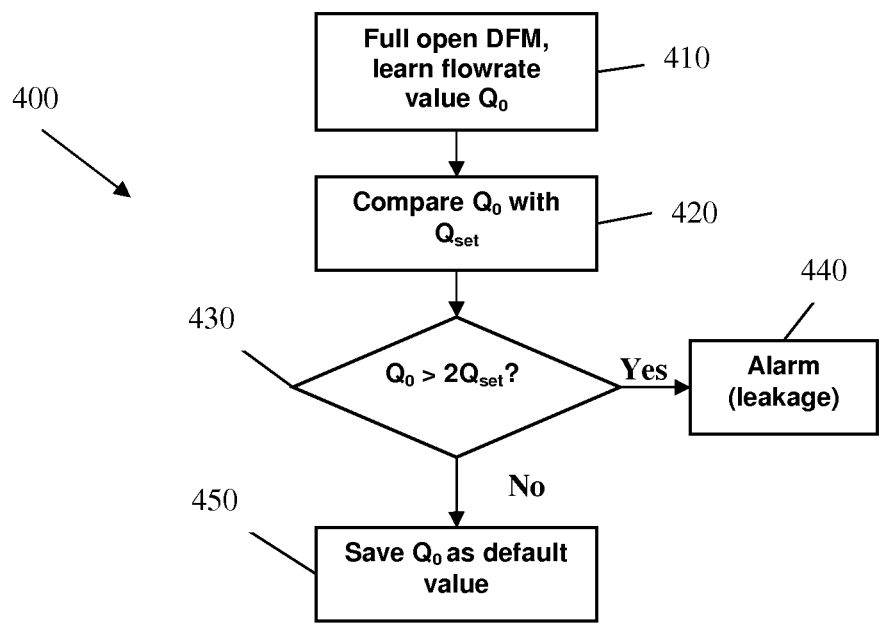
FIG. 4 is a flow diagram of a process of determining a reference flow rate for a leakage detection process.

Turning to FIG. 4, there is shown an outline of a process 400 for determining a reference flow rate value for a leakage detection process. The process 400 may be carried out with the system 10 of FIG. 1 or the system 10' of FIG. 2. At block 410 the flow meter 113 is set to fully open and gas at a user-defined pressure (set using pressure regulator 12) is flowed from gas source 11, 12 through leakage detection system 100 or 200 to shielding gas delivery module 14. The measured flow rate $Q_0$ from flow sensor 113 is transmitted to detection module 110. Detection module 110 generates a flow signal 115 and processor or comparator 117 compares $Q_0$ to a stored value $Q_{set}$. $Q_{set}$ is a separately measured reference value which is measured under laboratory conditions ensuring that there is no leakage. $Q_0$ tested using system 10 should be very close to $Q_{set}$ theoretically, but process 400 allows for some variation. In particular, if $Q_0$ is smaller than $2*Q_{set}$ (block 430), process 400 deems $Q_0$ to be accurate, and stores $Q_0$ as the reference flow rate value (block 450). If $Q_0$ is larger than $2*Q_{set}$, process 400 deems (block 440) that there is a leakage in the pipeline. In this case, the pipeline should be repaired, and the process 400 repeated until a valid value of $Q_0<2*Q_{set}$ is obtained.

Figure 5:
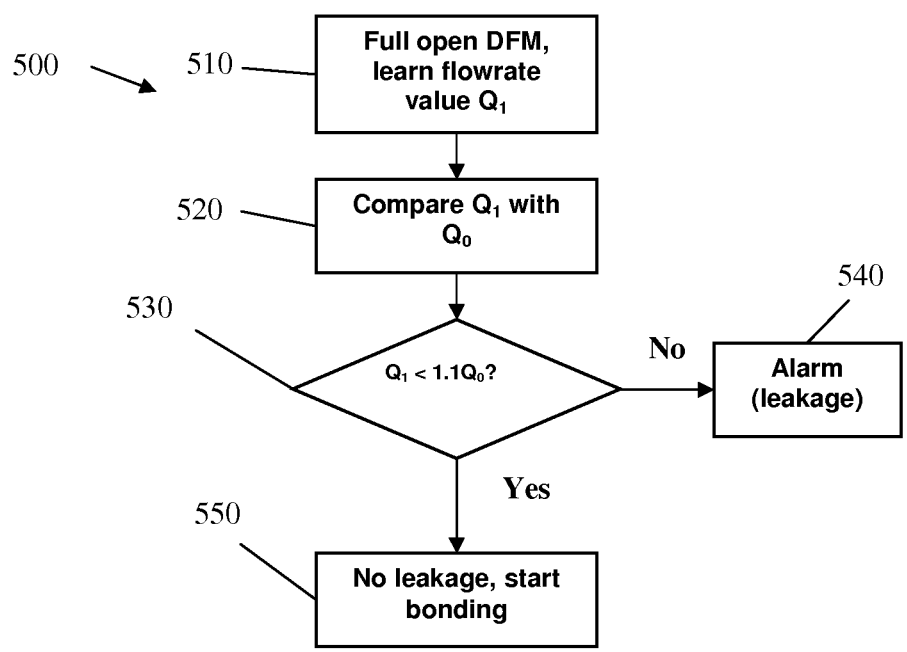
FIG. 5 is a flow diagram of a leakage detection process.

FIG. 5 shows an exemplary leakage detection process 500 carried out by leakage determination module 118, using the value of $Q_0$ obtained from reference value determination 400. In process 500, the flow meter 113 is set to fully open and gas at a user-defined pressure (which may be an operating pressure for a subsequent wire bonding process, for example) is flowed from gas source 11, 12 through leakage detection system 100 or 200 to shielding gas delivery module 14. Flow sensor 113 measures the flow rate $Q_1$ (block 510) and transmits it to detection module 110. Detection module 110 generates a flow signal 115 and processor or comparator 117 compares $Q_1$ to the previously stored reference value $Q_0$ (block 520). If an increase in flow rate larger than 10% ($Q_1>1.1Q_0$) is detected (block 530), this signifies a leakage and an alarm is triggered (block 540). Otherwise, process 500 signals to a control system of the wire bonding tool that there is no leakage and that the wire bonding process can begin (block 550).

EXAMPLE

The ability of system 10 or 10' to detect leakages was determined using a series of tests with regulator 12 set to 0.1 MPa, 0.2 MPa and 0.3 MPa respectively and with flow resistor 300 connected between flow control system 120 and shielding gas delivery module 14. Flow meter 113 was set fully open and flow control system 120 was set to a flow rate of 5 L/minute. Three different sections of tubing were used for testing: one with no leakage, one with a small leakage (via a small hole in the tubing wall), and one with large leakage (via a large hole in the tubing wall). The flow rates measured by flow meter 113 for the no leakage and small leakage cases are shown in Table 1.

TABLE 1 flow rate increase in the presence of a leak

| regulator pressure (MPa) | flow rate - no leakage (L/minute) | flow rate - small leakage (L/minute) | increase |
|---|---|---|---|
| 0.1 | 1.10 | 1.30 | 18.2% |
| 0.2 | 1.80 | 2.17 | 20.6% |
| 0.3 | 2.43 | 2.96 | 21.8% |

As can be seen from the table, at all pressures the flow resistance in the pipeline resulted in a large increase (more than 18%), meaning that the small leakage was easily detectable. As expected, the flow rate increases (results not shown) for the large leakage case were even more dramatic, and the large leakage was also readily detectable.

Advantageously, according to the above embodiments, leakages between the flow sensor 113 and the shielding gas delivery module can be detected quickly and accurately. With the addition of a flow resistor, leakages can be detected using a single sensor which can be mounted at a location away from the gas delivery module, yet still be able to detect leakages after the sensor location. This is not possible with conventional flow sensors alone since they cannot measure the flow rate downstream of the sensor location. In certain embodiments, as discussed above, an active flow rate elevation system may be added to temporarily increase the flow rate for testing purposes, thereby allowing accurate leakage testing even if the flow sensor 113 has poor resolution.

Although particular embodiments of the invention have been described in detail, many modifications and variations are possible within the scope of the invention, as will be clear to a skilled reader.

The invention claimed is:

1. A leakage detection system for detecting leakage in a gas supply system comprising a gas source connected to a gas delivery module by a pipeline, the leakage detection system comprising:
a flow sensor connectable along the pipeline remotely from an inlet of the gas delivery module; and
a detection module configured to receive signals representing a measured flow parameter from the flow sensor, and to compare the measured flow parameter to a stored leakage-free reference value to detect a change in flow parameter in the presence of a leak;
wherein a flow resistance between the detection module and an outlet of the gas delivery module amplifies the change in flow parameter in the presence of a leak,
wherein the flow resistance comprises a flow resistor element, the flow resistor element being connectable between the flow sensor and the inlet of the gas delivery module.

2. A leakage detection system according to claim 1, wherein the flow resistance comprises an intrinsic flow resistance of the gas delivery module.

3. A leakage detection system according to claim 1, comprising a flow rate elevation system connectable between the gas source and the flow sensor for temporarily changing the flow rate in the pipeline.

4. A gas supply system for a wire bonding process, comprising:
a gas source;
a gas delivery module; and
a leakage detection system according to claim 1, the leakage detection system being connected between the gas source and the gas delivery module.

5. A method of detecting leakage in a pipeline connected between a gas source and a gas delivery module, the method comprising steps of:
connecting a flow parameter sensor along the pipeline remotely from an inlet of the gas delivery module;
introducing or changing a flow resistance in the pipeline;
measuring a flow parameter along the pipeline using the flow parameter sensor;
comparing the flow parameter to a stored leakage-free reference value; and
if the flow parameter is different from a predetermined level above the leakage-free reference value, determining that there is a leakage in the pipeline.

6. A method according to claim 5, wherein the predetermined level is 10% above the leakage-free reference value.

7. A method according to claim 5, further comprising temporarily increasing the flow rate from the gas source.

8. A method according to claim 5, further comprising determining the leakage-free reference value.

* * * * *